US008546801B2

(12) United States Patent
Muta

(10) Patent No.: US 8,546,801 B2
(45) Date of Patent: Oct. 1, 2013

(54) SEMICONDUCTOR APPARATUS MANUFACTURING METHOD AND SEMICONDUCTOR APPARATUS

(75) Inventor: Tadayoshi Muta, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 44 days.

(21) Appl. No.: 12/922,530

(22) PCT Filed: Mar. 17, 2009

(86) PCT No.: PCT/JP2009/055726
§ 371 (c)(1),
(2), (4) Date: Sep. 14, 2010

(87) PCT Pub. No.: WO2009/116677
PCT Pub. Date: Sep. 24, 2009

(65) Prior Publication Data
US 2011/0006303 A1   Jan. 13, 2011

(30) Foreign Application Priority Data

Mar. 18, 2008 (JP) ................................. 2008-068714
Mar. 12, 2009 (JP) ................................. 2009-059558

(51) Int. Cl.
*H01L 23/58* (2006.01)
(52) U.S. Cl.
USPC .............................. 257/48; 257/774; 257/775
(58) Field of Classification Search
USPC ............ 257/48, 774, 775, E23.011, E29.119, 257/E23.067
See application file for complete search history.

(56) References Cited

U.S. PATENT DOCUMENTS

| | | | | |
|---|---|---|---|---|
| 5,081,067 A * | 1/1992 | Shimizu et al. | ............ | 228/123.1 |
| 5,144,228 A * | 9/1992 | Sorna et al. | .............. | 324/756.03 |
| 5,594,549 A * | 1/1997 | Mori et al. | ..................... | 356/401 |
| 5,790,319 A * | 8/1998 | Okada et al. | .................. | 359/694 |
| 6,127,733 A * | 10/2000 | Kinoshita | ...................... | 257/773 |
| 6,232,669 B1 * | 5/2001 | Khoury et al. | ................. | 257/784 |
| 6,278,129 B1 * | 8/2001 | Sugasawara et al. | ........... | 257/48 |
| 6,300,686 B1 * | 10/2001 | Hirano et al. | .................. | 257/783 |
| 6,486,006 B2 * | 11/2002 | Hirano et al. | ................. | 438/125 |
| 6,525,548 B1 * | 2/2003 | Nishio | .......................... | 324/699 |
| 6,770,906 B2 * | 8/2004 | Corbett et al. | .................. | 257/48 |
| 6,856,023 B2 | 2/2005 | Muta et al. | ..................... | 257/774 |
| 7,271,015 B2 * | 9/2007 | Okamoto et al. | ............... | 438/14 |

(Continued)

FOREIGN PATENT DOCUMENTS

JP   09-092675 A   4/1997
JP   10-270521 A   10/1998

(Continued)

*Primary Examiner* — Fernando L Toledo
*Assistant Examiner* — Mohammed Shamsuzzaman
(74) *Attorney, Agent, or Firm* — Fitzpatrick, Cella, Harper & Scinto

(57) ABSTRACT

Provided is a semiconductor apparatus which may check a state of connection of a penetrating electrode in a semiconductor substrate with ease. A semiconductor apparatus manufacturing method includes: forming in a semiconductor substrate at least three kinds of the through-holes each having a large area, a middle area, and a small area of openings; forming a conductive layer on an inner surface of the at least three kinds of the through-holes having different areas of the openings to form the penetrating electrodes; and measuring resistance values of the penetrating electrode including the through-hole having the large area of the opening and the penetrating electrode including the through-hole having the small area of the opening among the three kinds of the penetrating electrodes to determine states of connection of the penetrating electrodes.

3 Claims, 9 Drawing Sheets

(56) References Cited

U.S. PATENT DOCUMENTS

| | | | |
|---|---|---|---|
| 7,301,240 B2 * | 11/2007 | Hasunuma et al. | 257/774 |
| 7,311,531 B2 * | 12/2007 | Igarashi et al. | 439/91 |
| 7,312,141 B2 * | 12/2007 | Dunham et al. | 438/597 |
| 7,399,706 B2 * | 7/2008 | Omoto et al. | 438/687 |
| 7,443,031 B2 * | 10/2008 | Domae et al. | 257/758 |
| 2002/0028536 A1 * | 3/2002 | Hirano et al. | 438/112 |
| 2003/0080435 A1 * | 5/2003 | Dunham et al. | 257/774 |
| 2003/0151047 A1 * | 8/2003 | Corbett et al. | 257/48 |
| 2004/0012383 A1 * | 1/2004 | Kimura | 324/158.1 |
| 2004/0080040 A1 * | 4/2004 | Dotta et al. | 257/698 |
| 2004/0196031 A1 * | 10/2004 | Nagano | 324/230 |
| 2005/0051902 A1 * | 3/2005 | Okajima | 257/774 |
| 2005/0077514 A1 * | 4/2005 | Lee | 257/48 |
| 2005/0199875 A1 * | 9/2005 | Umemura et al. | 257/48 |
| 2005/0211560 A1 * | 9/2005 | Matsuda et al. | 205/117 |
| 2005/0266677 A1 * | 12/2005 | Hayashi et al. | 438/627 |
| 2006/0033100 A1 * | 2/2006 | Kokubo et al. | 257/48 |
| 2007/0040245 A1 * | 2/2007 | Seno et al. | 257/666 |
| 2007/0290300 A1 * | 12/2007 | Kawakami | 257/621 |
| 2008/0246030 A1 * | 10/2008 | Satya et al. | 257/48 |
| 2008/0284452 A1 * | 11/2008 | Sakamoto | 324/719 |
| 2009/0015285 A1 * | 1/2009 | Farooq et al. | 324/763 |
| 2009/0140756 A1 * | 6/2009 | Yoshioka et al. | 324/754 |
| 2009/0166621 A1 * | 7/2009 | Li et al. | 257/48 |
| 2009/0212284 A1 * | 8/2009 | Otremba et al. | 257/48 |
| 2009/0239377 A1 * | 9/2009 | Motoyama | 438/643 |
| 2010/0127403 A1 | 5/2010 | Muta | 257/774 |
| 2010/0147682 A1 * | 6/2010 | Nakatani et al. | 204/400 |
| 2011/0204357 A1 * | 8/2011 | Izuha | 257/48 |
| 2012/0032346 A1 * | 2/2012 | Najafi et al. | 257/774 |

FOREIGN PATENT DOCUMENTS

| | | |
|---|---|---|
| JP | 2002-110698 A | 4/2002 |
| JP | 2004-152810 A | 5/2004 |
| JP | 2007-208098 A | 8/2007 |

* cited by examiner

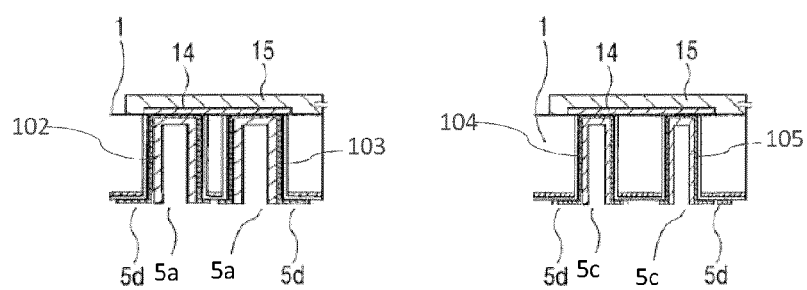

SEMICONDUCTOR APPARATUS MANUFACTURING METHOD AND SEMICONDUCTOR APPARATUS

TECHNICAL FIELD

The present invention relates to a semiconductor apparatus manufacturing method and a semiconductor apparatus which may determine a connection resistance of a penetrating electrode with ease.

BACKGROUND ART

In recent years, along with miniaturization and higher performance of electronic equipment, a semiconductor apparatus has been required to be miniaturized and become denser. Therefore, there is employed a configuration in which, by conduction between a front surface and a rear surface of a semiconductor substrate using a penetrating electrode, connection to an external terminal is made at the rear surface of the semiconductor substrate (see Japanese Patent Application Laid-Open No. H09-092675). It is also known, in order to raise the packing density, wiring is also formed on rear surfaces of multiple semiconductor substrates, the multiple semiconductor substrates are laminated on one another, and the front and rear surfaces thereof are electrically connected to each other (see U.S. Pat. No. 739,712).

Further, there have been increasing needs for a penetrating electrode of a semiconductor apparatus in various fields including a semiconductor memory, a semiconductor chip used for a CMOS sensor, an AF sensor, or the like, a semiconductor package in which multiple semiconductor chips are laminated, and connection in an inkjet head body.

In a semiconductor apparatus in which a penetrating electrode is formed in a semiconductor substrate, when the through-hole is formed in the semiconductor substrate, due to unevenness in a hole-making process or the like, an area of an opening of the through-hole may not be made uniform in some cases. In such cases, the state of connection between a front surface and a rear surface of the semiconductor substrate using a penetrating electrode also varies in some cases.

In order to secure reliability, it is important to know the state of connection by the penetrating electrode, and a method of preferably checking the state of connection is desired.

Further, in a semiconductor substrate configured so that a contact probe for electrical checking may not be put on an electrode portion on a semiconductor device surface side, because the penetrating electrode is connected to the semiconductor device, there is no method suitable for checking a resistance value of several ohms. Therefore, the state of connection between the penetrating electrode and a pad portion of the semiconductor substrate may not be checked with an electrical checker.

DISCLOSURE OF THE INVENTION

An object of the present invention is to provide a semiconductor apparatus which may check a state of connection of a penetrating electrode in a semiconductor substrate with ease.

According to the present invention, there is provided a method of manufacturing a semiconductor apparatus including: a conductive layer formed on an inner surface of a through-hole formed in a semiconductor substrate; and a penetrating electrode for electrically connecting a front surface and a rear surface of the semiconductor substrate, the method including: forming in the semiconductor substrate at least three kinds of the through-holes each having a large area, a middle area, and a small area of the openings; forming the conductive layer on the inner surface of the at least three kinds of the through-holes having different areas of the openings to form the penetrating electrodes; and measuring resistance values of the penetrating electrode including the through-hole having the large area of the opening and the penetrating electrode including the through-hole having the small area of the opening among the three kinds of the penetrating electrodes to determine states of connection of the penetrating electrodes.

A semiconductor apparatus according to the present invention includes a penetrating electrode having a through-hole formed in a semiconductor substrate, wherein the semiconductor apparatus includes at least three kinds of the penetrating electrodes having through-holes each having a large area, a medium area, and a small area of the openings, and at least the penetrating electrodes having the large area of the opening and the small area of the opening are connected to a check pattern.

By providing at least three kinds of penetrating electrodes each having the through-hole with the large, medium, and small areas of the openings, the state of connection of the penetrating electrodes in the semiconductor substrate may be checked with ease.

Further features of the present invention will become apparent from the following description of exemplary embodiments with reference to the attached drawings.

BRIEF DESCRIPTION OF THE DRAWINGS

FIGS. 1A, 1B, 1C and 1D illustrate a semiconductor apparatus according to an embodiment of the present invention, in which FIG. 1A is a plan view illustrating a circuit configuration thereof, FIG. 1B is a sectional view taken along the line 1B-1B of FIG. 1A, FIG. 1C is a sectional view taken along the line 1C-1C of FIG. 1A and FIG. 1D is sectional View taken along the line 1D-1D of FIG. 1A.

BEST MODE FOR CARRYING OUT THE INVENTION

Best mode for carrying out the present invention is described based on the drawings.

Figure 9:
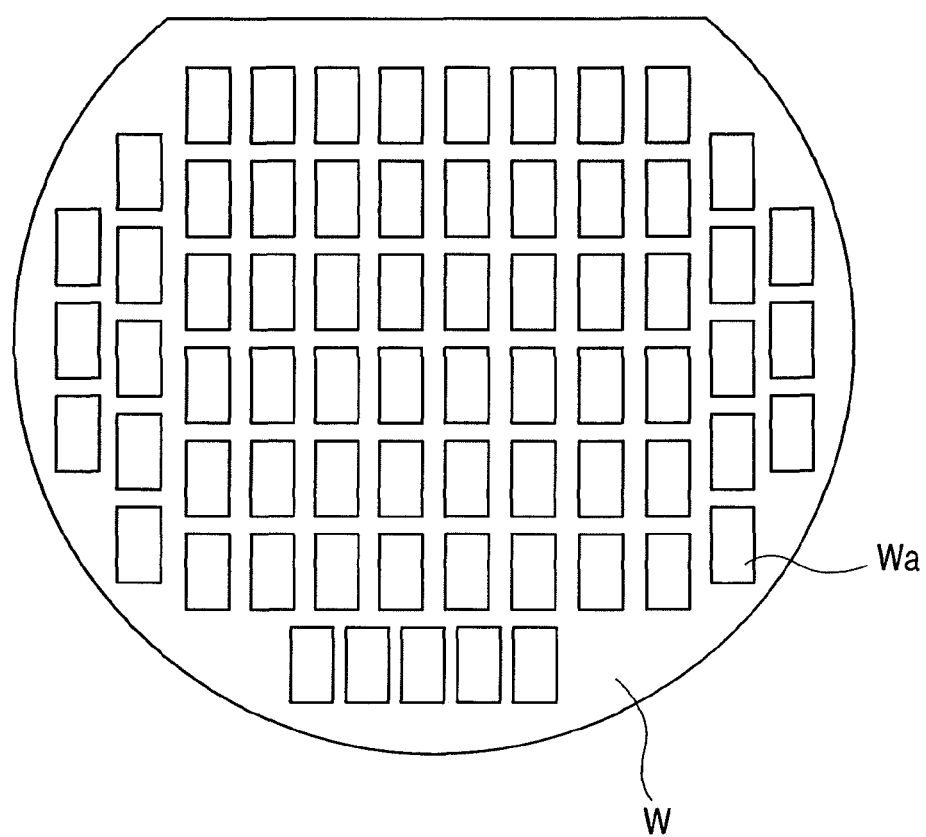
FIG. 9 is a plan view illustrating a wafer from which a semiconductor apparatus is cut out.

First, a method of manufacturing a semiconductor apparatus according to the present invention is described. FIGS. 2A to 6 are views illustrating steps for describing a manufacturing method according to an embodiment of the present invention. As illustrated in FIG. 9, a semiconductor apparatus as used herein may refer to a single semiconductor apparatus Wa obtained by forming multiple semiconductor apparatus on a substrate such as a semiconductor wafer and cutting and separating the formed semiconductor apparatus into individuals by dicing, or alternatively, may refer to all the multiple semiconductor apparatuses W formed on the substrate such as a semiconductor wafer.

Figure 1A:
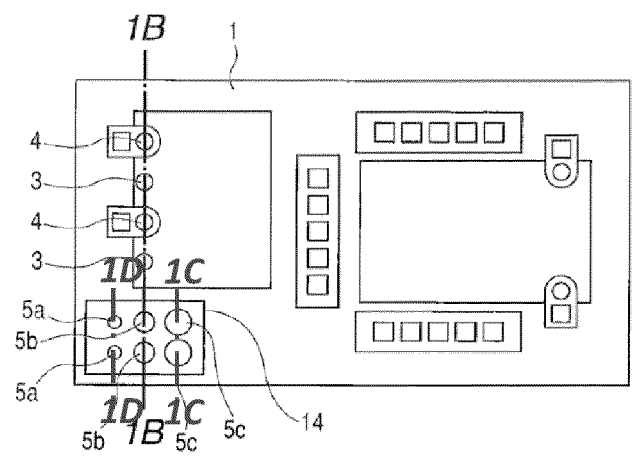
Figure 1B:
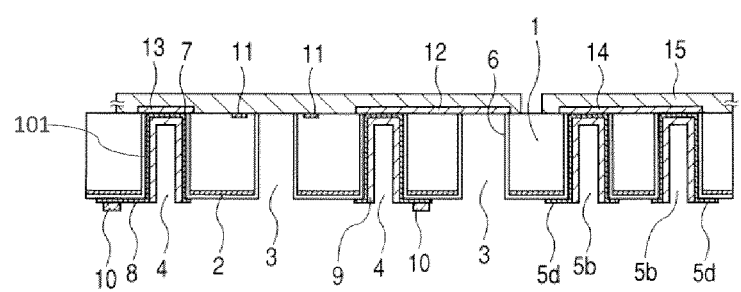
Figure 2A:
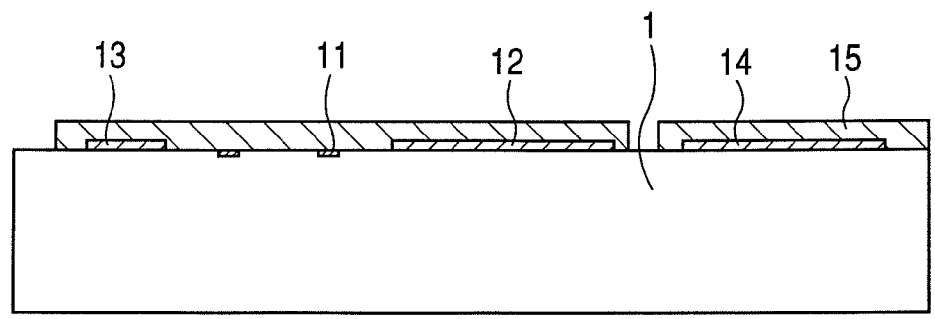
FIGS. 2A, 2B, and 2C are views illustrating a semiconductor substrate, a WSS attaching/semiconductor substrate thinning/protective film forming process, and a patterning/hole-making process, respectively, in a method of manufacturing the semiconductor apparatus illustrated in FIG. 1.

FIG. 2A illustrates a state in which electrode pads 13, semiconductor devices 11, and wiring 12 are formed on a semiconductor substrate 1 by an ordinary semiconductor process. A structure 15 for covering the semiconductor devices 11, the electrode pads 13, and the wiring 12 is formed on a front surface of the semiconductor substrate 1. As the semiconductor substrate 1, a substrate mainly formed of a single element such as silicon, germanium, and selenium, a compound such as an oxide, a sulfide, a selenide, a telluride, an antimony compound, an arsenic compound, and a phosphorus compound, glass, ceramic, an organic semiconductor material, or the like may be used. As the shape of the semiconductor substrate 1, a wafer, a square, or a polygon may be suitably used, and a complicatedly processed shape extensively used in a micromachine or the like may also be used.

As the structure 15, an organic material, an inorganic material, or a material formed of an organic material and an inorganic material may be used.

Figure 2B:
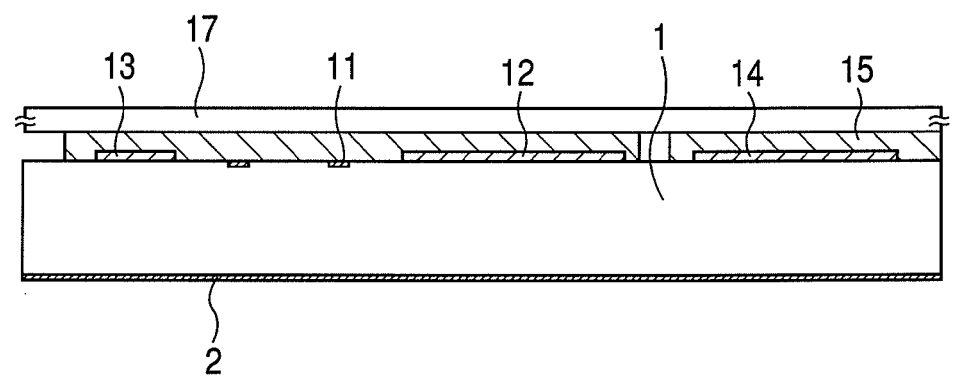

As illustrated in FIG. 2B, a WSS 17 which is a wafer reinforcing material is attached onto the structure 15 to reinforce the wafer. Then, a rear surface side is ground by a back grinder to reduce the thickness of the semiconductor substrate 1. After the thinning is carried out, a trimming process of an end face of the wafer and a removing process of crushed pieces by a spin etcher are carried out, which suppresses failures in a post-process due to a crack in an end face of the wafer and due to crushed pieces. A protective film 2 may be formed on a rear surface of the semiconductor substrate 1 by CVD or the like. As the protective film 2, $SiO_2$, SiN, or the like is used.

Figure 2C:
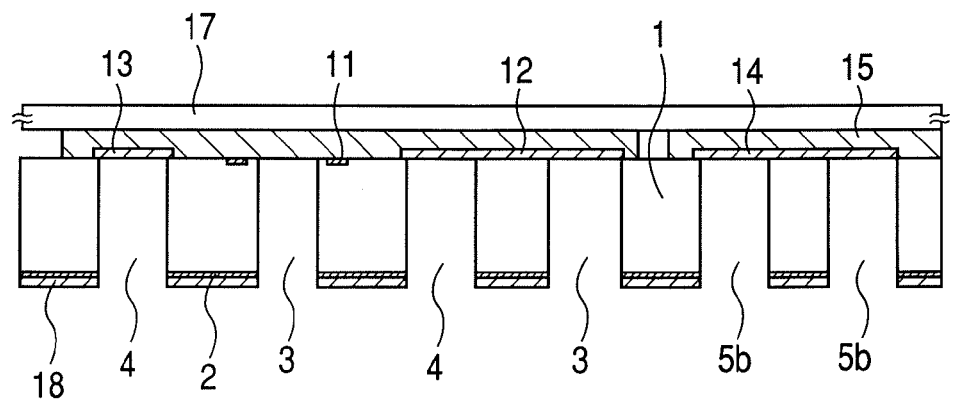

Then, through-holes are formed from the rear surface of the semiconductor substrate at portions opposed to the electrode pads 13 formed on the front surface of the semiconductor substrate to expose the electrode pads at the bottom of the through-holes. In FIG. 2C, the through-holes for forming penetrating electrodes are denoted by reference symbols 4 and 5b. Reference numeral 3 does not denote the through-holes for forming the penetrating electrodes, but the holes denoted by 3 may be made simultaneously. Further, through-holes 5a (not shown) having the areas of the opening which is smaller than those of 4 and 5b and through-holes 5c (not shown) having the area of the opening which is larger than those of 4 and 5b are also formed simultaneously. The through-holes may be formed by drilling, laser processing, photoexcited anodization, etching, ICP-RIE, or the like, and the method is appropriately selected taking into consideration the material of the semiconductor substrate 1, the shape of the through-holes 4, the aspect ratio, the productivity, and the like. A mask 18 may be formed on the rear surface of the semiconductor substrate 1 (or, on the protective film 2 when the protective film 2 is formed on the rear surface and the front surface) and patterned to form the through-holes. With regard to the processing of the through-holes, the shape and the processing speed considerably vary depending on the area of the openings thereof. Further, the shape and the processing speed vary depending on the processing equipment and the location in the semiconductor substrate.

Figure 7:
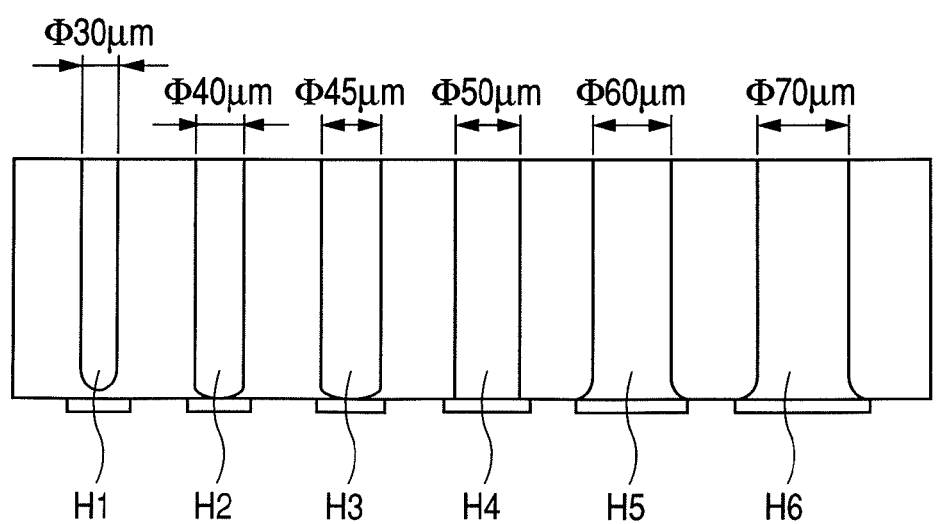
FIG. 7 is a view illustrating shapes of holes of penetrating electrodes.
Figure 8:
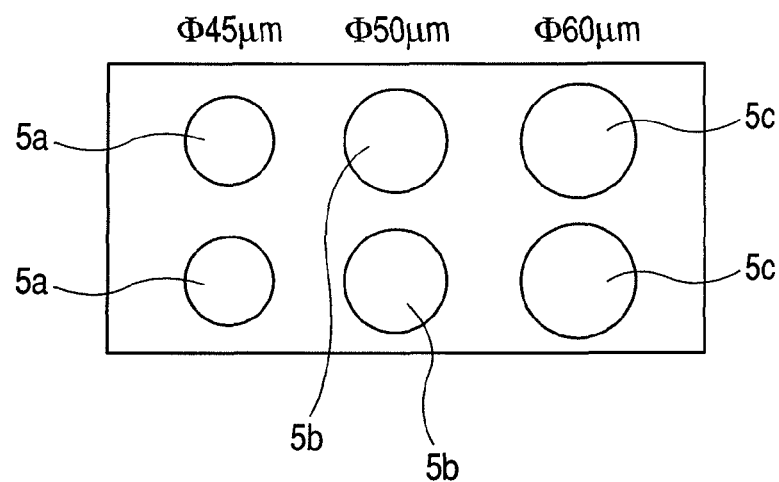
FIG. 8 is a plan view illustrating actual sizes of penetrating electrodes for checking.

As an example, as illustrated in FIG. 7, when a penetrating electrode with a hole H4 having a diameter of 50 μdm (the area of the opening is about 2,000 $μm^2$) is to be formed, hole shapes such as holes H1, H2, H3, H5, and H6 having diameters of 30 μm, 40 μm, 45 μm, 60 μm, and 70 μm, respectively, are liable to be generated. When the area of the opening is large, there is a case in which the bottom portion of the through-hole is overetched, it is difficult for a conductive layer, which is to be formed in a post-process, to be attached to the overetched portion, and thus, the state of electrical connection becomes worse. On the other hand, when the area of the opening is small, there is a case in which the through-hole is not completely formed to the bottom portion, a sufficient contact area between a conductive layer to be formed in a post-process and the electrode pad formed at the bottom portion of the through-hole may not be secured, and thus, the state of electrical connection becomes worse. Therefore, when, for example, the hole H4 having a diameter of 50 μm is adopted to form a penetrating electrode, at least three kinds of through-holes including a hole having the area of the opening which is larger than that of the hole having a diameter of 50 μm and a hole having the area of the opening which is smaller than that of the hole having a diameter of 50 μm are simultaneously formed. As the hole having the area of the opening which is larger than that of the hole having a diameter of 50 μm, the hole H5 having a diameter of 60 μm, for example, is formed. As the hole having the area of the opening smaller than that of the hole having a diameter of 50 μm, the hole H3 having a diameter of 45 μm, for example, is formed. In other words, at least three kinds of through-holes having the areas of the openings large, medium, and small, respectively, are formed. In the following, a through-hole having the area of the opening which is larger than that of the through-hole adopted as the penetrating electrode is referred to as a large through-hole, while a through-hole having the area of the opening which is smaller than that of the through-hole adopted as the penetrating electrode is referred to as a small through-hole. Then, the conductive layer described in a post-process is formed on inner surfaces of the three kinds of the through-holes to form three kinds of penetrating electrodes. The connection resistances of at least the penetrating electrode having the large through-hole and the penetrating electrode having the small through-hole are measured. If the connection resistances of those penetrating electrodes satisfy a standard, it obviously follows that the state of connection of the penetrating electrode with the hole H4 having a diameter of 50 μm which is adopted as the through-hole of the penetrating electrode satisfies the standard. The connection resistance of a penetrating electrode is measured by bringing one end of a contact probe for electrical checking into contact with the conductive layer to be formed on an inner surface of the through-hole in a post-process described below or wiring connected to the conductive layer from the rear surface side of the semiconductor substrate. Then, the other end of the contact probe for electrical checking is put on the electrode pad formed on the front surface of the semiconductor substrate or wiring connected to the electrode pad. By measuring the electrical resistance value in this way, the state of connection of the penetrating electrode may be measured. However, there is a case in which the structure is formed on the front surface of the semiconductor substrate and the contact probe for electrical checking may not be put on the electrode pad from the front surface side. In such a case, as illustrated in FIG. 8, two sets of the three penetrating electrodes having the large, medium, and small through-holes, respectively, are arranged, specifically, pairs of penetrating electrodes having the same diameters are arranged so as to be in proximity to each other, and the penetrating electrodes having the same diameters are connected to each other by check pattern wiring. This enables the electrical resistance values to be measured from the rear surface side. Here, the example in which the large, medium, and small through-holes are formed for checking is described, but an object of the present invention is attained by forming at least the large and small through-holes. In the following, penetrating electrodes having the through-holes 5a, 5b, and 5c connected to the check pattern are referred to as penetrating electrodes for checking.

When the connection resistance of the penetrating electrodes of the entire substrate such as a semiconductor wafer is measured, it is desirable that the penetrating electrodes for checking be formed at least at multiple locations in an end portion of the substrate such as a semiconductor wafer. It is more desirable that the penetrating electrodes for checking be formed also in a center portion. The speed of the hole-making process varies depending on the location on the substrate, and hence more accurate checking may be carried out by forming the penetrating electrodes for checking at multiple locations in an end portion of the substrate.

Figure 3A:
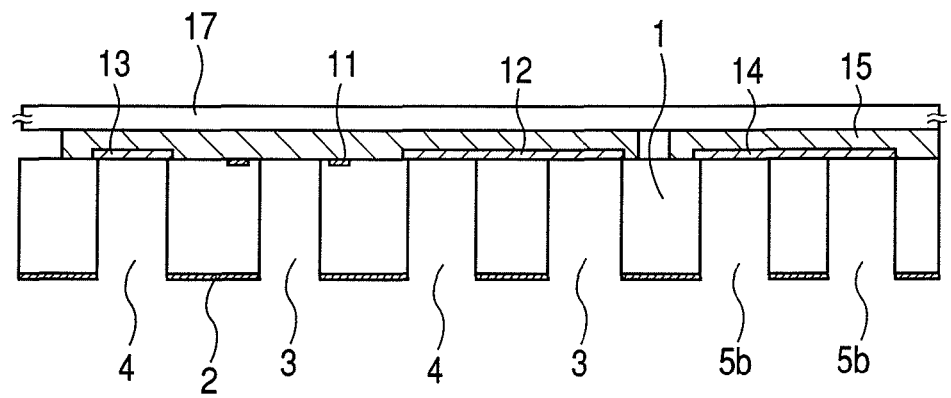
FIGS. 3A, 3B, and 3C are views illustrating a mask stripping process, a protective film forming process, and a barrier/seed layer forming process, respectively.
Figure 3B:
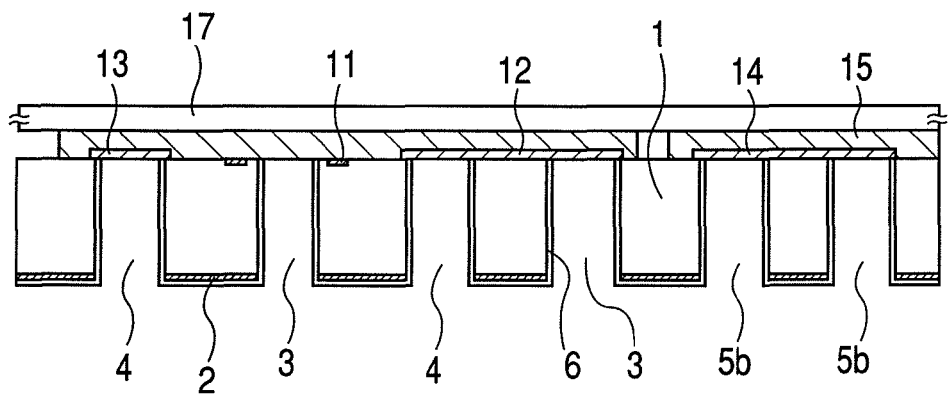

Then, in FIG. 3A, the mask 18 is stripped off, and, in FIG. 3B, a protective film 6 is formed on inner surfaces (wall surfaces) of the penetrating electrodes having the through-holes 4, of the penetrating electrodes for checking having the through-holes 5b, 5a (not shown), and 5c (not shown), and the like and on the rear surface of the semiconductor substrate 1. The protective film 6 is formed by applying an organic film material. The protective film 6 may also be formed by CVD, vapor deposition, or the like. Then, the protective film 6 formed on the surfaces of the electrode pads which are exposed at the bottom portions of the through-holes 4, 5b, 5a (not shown), and 5c (not shown) is removed by etching using a mask or the like to again expose the electrode pads at the bottom portions of the through-holes.

Figure 3C:
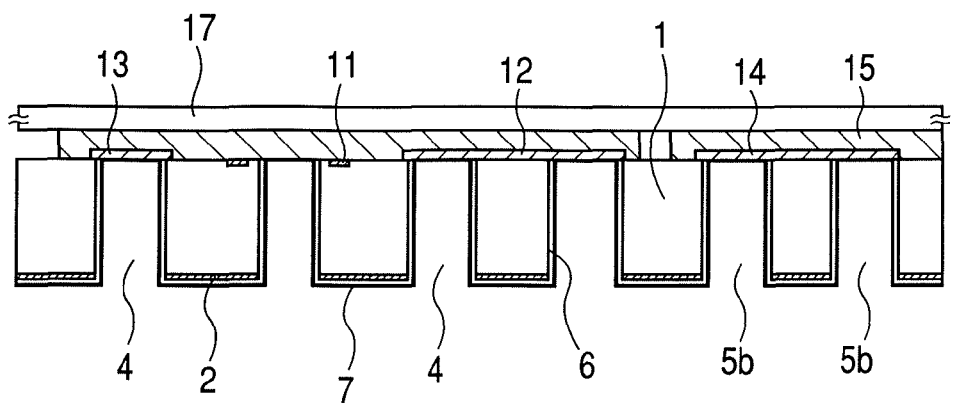

In FIG. 3C, the conductive layer is formed on the inner surfaces of the through-holes 4, 5b, 5a and 5c (side walls and bottom portions of the through-holes) and the rear surface of the semiconductor substrate 1. In this embodiment, a case in which the conductive layer is formed of a barrier/seed layer 7 and a plating layer 8 is described. However, as a matter of course, the present invention is not limited thereto, and the conductive layer may be formed of a single layer and may be formed of three or more layers. As the barrier/seed layer 7, Ti/Au or the like may be used. The barrier/seed layer 7 is formed by ion coating or vapor deposition polymerization. The barrier/seed layer 7 has very good adhesion to the plating layer 8 to be formed in the subsequent process and does not strip thereof.

Figure 4A:
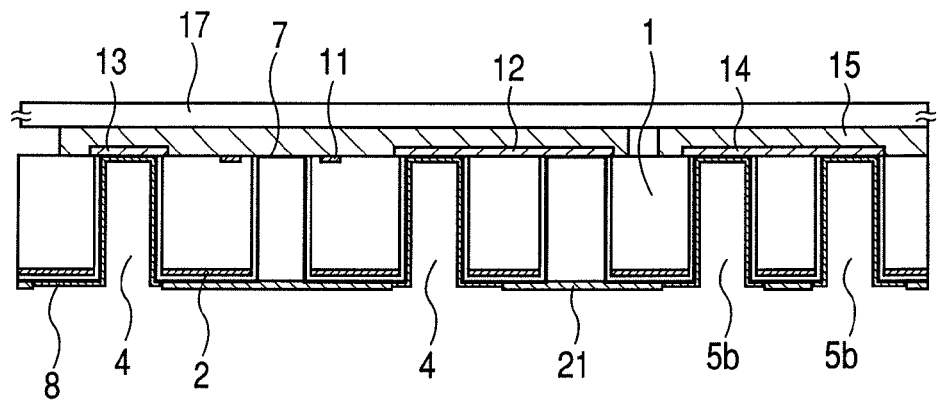
FIGS. 4A, 4B, and 4C are views illustrating a masking/plating process for forming a conductive layer, a mask stripping process, and a masking/plating process for forming bumps, respectively.

In FIG. 4A, the plating layer 8 is formed on the surface of the barrier/seed layer 7 formed in the penetrating electrodes for checking having the through-holes 5b, 5a (not shown), and 5c (not shown) and formed in the penetrating electrodes having the through-holes 4, and on the rear surface of the semiconductor substrate 1. The plating layer 8 forms electrical wiring for electrically connecting a front surface side and a rear surface side of the penetrating electrodes having the through-holes 4 and provides without fail conduction between the front surface side and the rear surface side of the semiconductor substrate 1. As the plating layer 8, a material which has a sufficient process margin and sufficient environmental tolerance and satisfies a design value, a tolerance, or the like may be used.

As the method of forming the conductive layer, PVD or CVD having the process temperature higher than 1,000° C. is difficult to use. However, dry plating, wet plating, jet printing, film formation using a conductive paste or a molten metal, or sputtering may be used in combination with electroplating, electroless plating, or the like, and appropriated selection is made according to the shape of the through-holes 4 of the penetrating electrodes and the aspect ratio.

As illustrated in FIG. 4A, the conductive layer is patterned by an ordinary photolithography process using a dry film mask 21. The conductive layer is selectively patterned such that the electrode pads 13 provided on the front surface of the semiconductor substrate 1 do not short-circuit. Further, portions of the rear surface of the semiconductor substrate 1, at which predetermined conductive wiring needs to be formed, are plated by patterning.

Figure 4B:
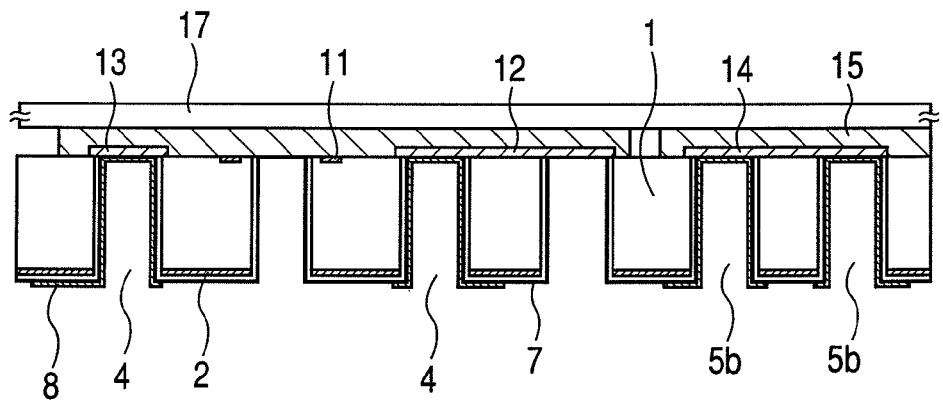

In FIG. 4B, the dry film mask 21 is stripped off.

Figure 4C:
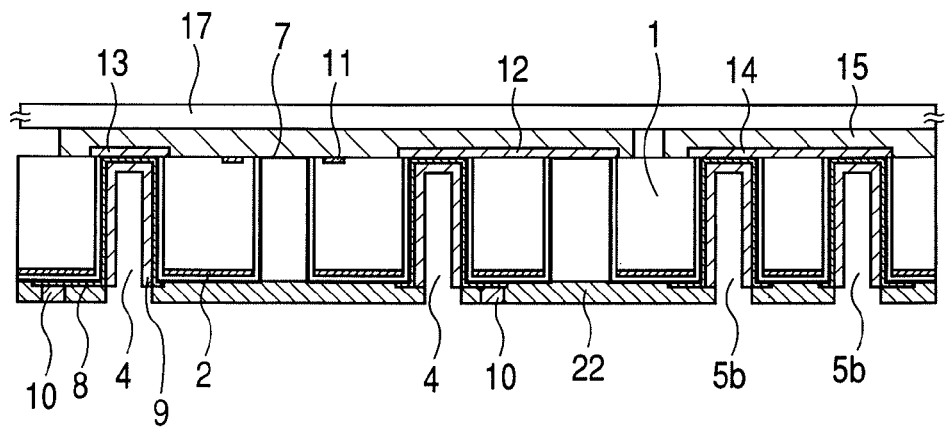
Figure 5A:
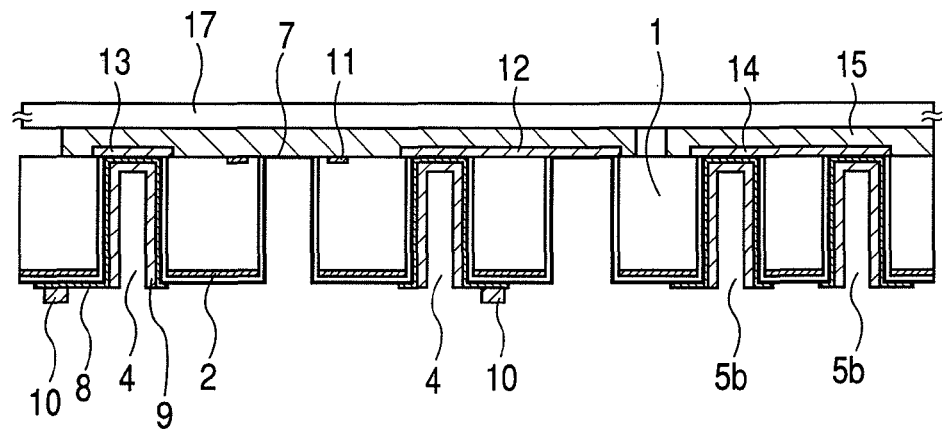
FIGS. 5A, 5B, and 5C are views illustrating a mask stripping process for forming bumps, a mask/etching process for etching a barrier/seed layer, and a mask stripping process, respectively.

In FIG. 4C, another masking is carried out again by a mask 22, plating is carried out at only necessary portions, and a metal film 9 and bumps 10 are formed. Then, as illustrated in FIG. 5A, the mask 22 is stripped off.

Figure 5B:
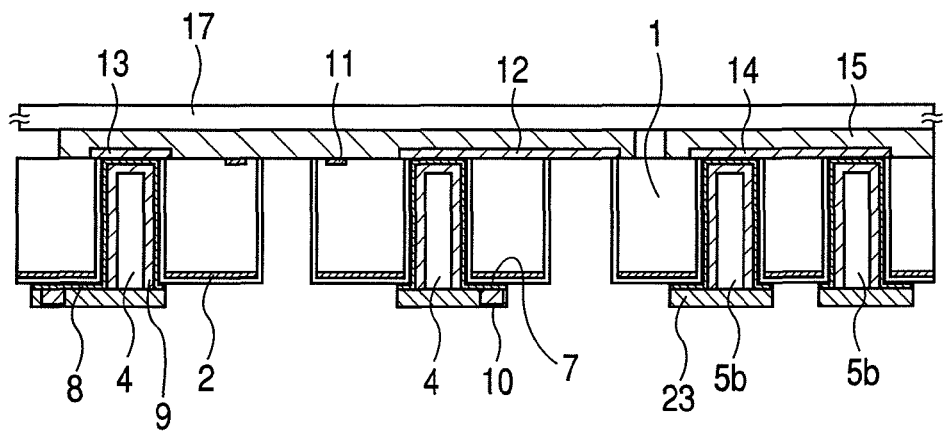

In FIG. 5B, another masking is carried out again by a mask 23 for the purpose of protecting the penetrating electrodes and the penetrating electrodes for checking, and the barrier/seed layer 7 in the through-holes 3 which are not holes for the electrodes is etched off. Here, the penetrating electrodes for checking having the through-holes 5b, 5a (not shown), and 5c (not shown) for determining connection between a power supply and the penetrating electrodes having the through-holes 4 and portions to be extraction electrodes 5 are masked in the same way to protect the check pattern.

Figure 5C:
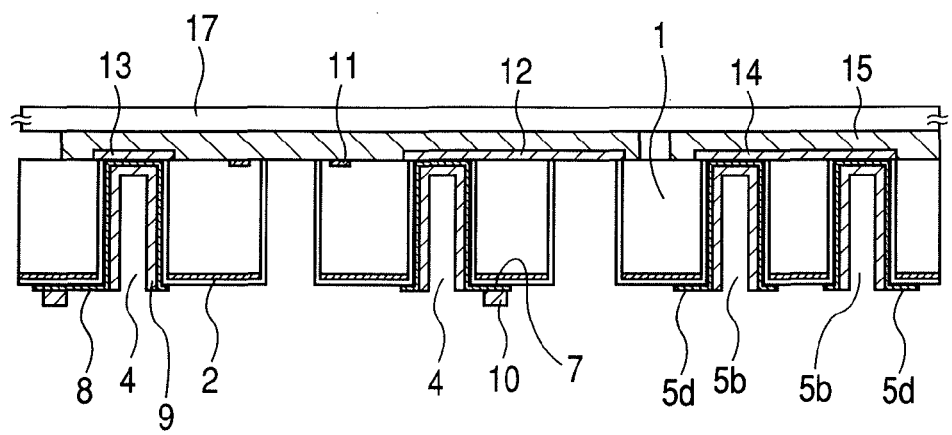

In FIG. 5C, the mask 23 formed on the barrier/seed layer 7 in the holes which are not holes for the electrodes is stripped off.

Figure 6:
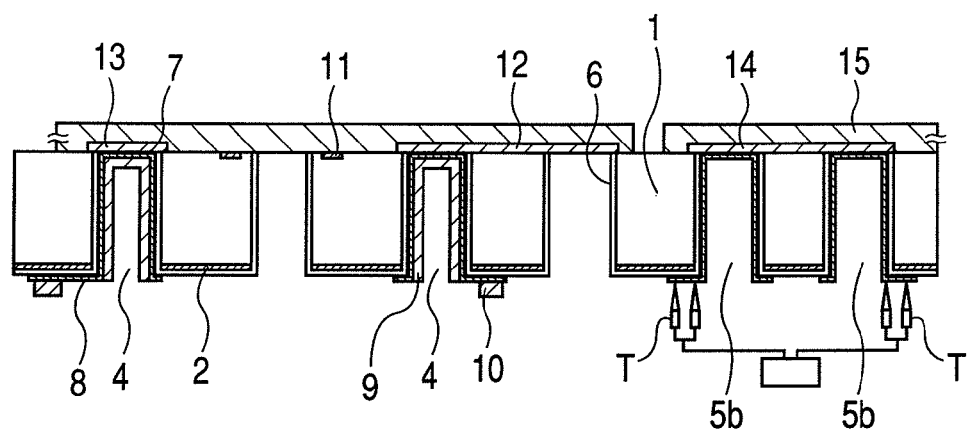
FIG. 6 is a view illustrating a resistance value measuring process.

Then, as illustrated in FIG. 6, the resistance values of the penetrating electrodes for checking having the through-holes 5b, 5a (not shown), and 5c (not shown) having the areas of the openings different from one another are measured using a four-terminal contact probe T for low-resistance electrical checking. In determination of the resistance values here, a reference value is specified for each of the areas of the openings, and the reliability of the electrical connection in the semiconductor apparatus is evaluated by comparison with the reference value.

When the resistance value is equal to or smaller than a predetermined value, finally, as illustrated in FIG. 9, the semiconductor apparatus Wa are cut and separated into individuals from the wafer W by dicing using an ordinary dicer.

Next, the semiconductor apparatus according to the present invention is described with reference to the drawings.

FIGS. 1A, 1B, 1C and 1D illustrate a semiconductor apparatus according to an embodiment. A semiconductor substrate 1 of the semiconductor apparatus includes a first protective film 2, through-holes 3, through-holes 4 for forming penetrating electrodes, and through-holes 5a, 5b, and 5c for forming penetrating electrodes for checking. The semiconductor substrate 1 further includes a second protective film 6 for protecting wall surfaces of the holes, a barrier/seed layer 7 and a plating layer 8 which form a conductive layer, a metal film 9, bumps 10. It should be noted that, in the following drawings, like reference symbols designate like or identical members illustrated in FIGS. 1A and 1B.

The semiconductor substrate 1 is mainly formed of a single element such as silicon, germanium, and selenium, a compound such as an oxide, a sulfide, a selenide, a telluride, an antimony compound, an arsenic compound, and a phosphorus compound, glass, ceramic, an organic semiconductor material, or the like.

Semiconductor devices 11, wiring 12, an electrode pad 13, and check pattern wiring 14 which is a wiring body having a resistance of 10Ω or smaller are formed on a front surface side of the semiconductor substrate 1. Those are formed in advance by a semiconductor process or the like on the front surface of the semiconductor substrate 1. The semiconductor devices 11 are semiconductor devices formed so as to be embedded from the front surface of the semiconductor substrate 1. The electrode pad 13 is an electrode pad formed on the front surface of the semiconductor substrate 1. The wiring 12 is wiring extending from a part of the electrode pad 13. The wiring 12 electrically connects the electrode pad 13 and the semiconductor devices 11.

The check pattern wiring 14 which forms a check pattern together with the penetrating electrodes for checking including the through-holes 5a, 5b, and 5c is a circuit for measuring a resistance value, and is formed on the front surface of the semiconductor substrate 1. When the area of the openings of the through-holes 5b is the same as that of the through-holes 4, there are formed three kinds of through-holes each having a different area of the opening, that is, large, medium, and small areas of the openings, in which through-holes 5a have the area of the opening which is smaller than that of 5b, and through-holes 5c having the area of the opening which is larger than that of 5b. Further, two groups of the three penetrating electrodes for checking including the large, medium, and small through-holes 5a, 5b, and 5c having the areas of the openings which are different from one another are provided, in other words, a pair of penetrating electrodes for checking, which have the same area of the openings, are provided for each area of the opening and are connected to each other by the check pattern wiring 14. In this embodiment, two penetrating electrodes for checking are provided for each area of the opening, but, if the check probe may be inserted from the front surface side of the semiconductor substrate, only one penetrating electrode for each area of the opening is sufficient for the checking. Further, in this embodiment, the penetrating electrodes for checking including the three kinds of through-holes 5a, 5b, and 5c each having the large, medium, and small areas of the openings, but, it is sufficient that at least the through-holes 5a and 5c having the different areas of the openings, that is, large and small, are formed. The semiconductor substrate 1 is covered with a structure 15 on a side of the semiconductor devices. Here, a penetrating electrode including a through-hole having the area of the opening which is larger than that of the through-holes 4 is defined as a large penetrating electrode, a penetrating electrode including a through-hole having the area of the opening which is the same as that of the through-holes 4 is defined as a medium penetrating electrode, and a penetrating electrode including a through-hole having the area of the opening which is smaller than that of the through-holes 4 is defined as a small penetrating electrode.

The conductive layer (a first conductive layer 101) is formed on the protective film 6 formed on the through-holes 4. The conductive layers (a second conductive layer 102, a third conductive layer 103) are formed on the through-holes 5a. The conductive layers are formed on the trough-holes 5b. The conductive layers (a fourth conductive layer 104, a fifth conductive layer 105) are formed on the through-holes 5c. And further, the metal film 9 and the bumps 10 are formed thereon.

Conventionally, penetrating electrodes in a semiconductor substrate are connected to devices, and thus a low resistance value may not be discriminated. However, in confirming the state of connection of a penetrating electrode, determination of a resistance value at a level of 0.1Ω to several ohms is extremely important.

According to this embodiment, a contact probe for electrical checking is brought into contact with extraction electrodes 5d which are provided on a rear surface side of the semiconductor apparatus and which are taken out from the penetrating electrodes for checking including the through-holes 5a, 5b, and 5c having the areas of the openings which are different from one another to measure the resistance value. By the measured resistance value, the resistance value of the penetrating electrode is discriminated.

More specifically, the penetrating electrodes for checking for determining electrical connection of the penetrating electrodes and the extraction electrodes 5d which are a wiring body having the resistance of 10Ω or smaller are formed on the rear surface side of the semiconductor substrate 1 in the process of manufacturing the semiconductor apparatus together with the penetrating electrodes and the like. Then, the contact probe for electrical checking is put on the extraction electrodes 5d to measure the connection resistance value of the semiconductor apparatus.

Conventionally, the circuit resistance of a semiconductor circuit is also measured at the same time, and thus subtle change in the resistance value of the penetrating electrodes alone may not be read. There is no problem with regard to the initial operation, but reliability over a long term may not be determined without additional labor such as aging.

According to this embodiment, by reading the resistance values of the penetrating electrodes for checking, determination may be made. For example, when the resistance value is 1Ω, the penetrating electrode is considered to hold for 100 or more heat cycles, and, when the resistance value is 100Ω, the penetrating electrode is considered to hold only for 10 cycles. In this case, data determined in advance by experiments or simulations for each design is used as discrimination data.

Using the discrimination data, if the measured resistance value is equal to or smaller than a desired resistance value, the state of connection of the penetrating electrode of the product may be regarded as satisfactory.

Due to unevenness of the process such as a hole-making process itself, or, due to the location of the chips in a wafer, the state of connection of the penetrating electrodes is thought to vary among product chips. Therefore, it is extremely effective to be able to check the electrical connection of the product itself using the check pattern formed for each product chip.

Further, nowadays, aging is generally omitted, and to use aging again simply because the device including a penetrating electrode of a new technology formed therein has problems in view of the cost and the labor. The present invention may solve those problems with ease.

EXAMPLE

In a process corresponding to FIG. 2A, a 6-inch semiconductor substrate 1 which is a substrate formed of silicon is prepared. An electrode pad 13, semiconductor devices 11, and wiring 12 are provided in advance on a front surface of the semiconductor substrate 1. A protective film (not shown) with a thickness of 0.1 μm is formed on the front surface of the semiconductor substrate 1. More specifically, the protective film is formed between the front surface of the semiconductor devices 11 and the semiconductor substrate 1, and the electrode pad 13 and the wiring 12. The thickness of the electrode pad 13 is 2.1 μm and the thickness of the wiring 12 is 0.6 μm.

The protective layer is formed by laminating SiO$_2$ and SiN by a semiconductor process. The thickness of the semiconductor substrate 1 is 200 μm.

Next, in a process corresponding to FIGS. 2B, 2C, and 3A, ICP-RIE is used to form holes such as through-holes 4. The diameter and the aspect ratio of the through-holes 4 are 53 μm and about 4, respectively.

Then, in a process corresponding to FIG. 3B, a silane coupling material is used as a coating by immersion in a solution, and a protective film 6 is formed by CVD. In the silane coupling process, 0.1% of KBM-603 (Shin-Etsu Chemical Co., Ltd.) in a methanol solvent or the like is used and processes such as draining the liquid of the coupling material, and processes such as drying, washing with water, and drying are carried out.

Next, in a process corresponding to FIG. 3C, a barrier/seed layer 7 is formed on inner surfaces of the penetrating electrodes 4 and the like and on the whole rear surfaces of the substrate 1 by ion coating.

Then, in a process corresponding to FIGS. 4A and 4B, a photosensitive dry film resist, a photosensitive liquid resist, a metal mask, or the like is used as an etching resist to carry out patterning for removing by O$_2$ ashing, CDE, or the like the organic insulating film formed by CVD except for necessary portions. Then, the conductive layer 8 is formed by electroplating and the mask is stripped off.

Next, in a process corresponding to FIG. 4C, the metal film 9 and the bumps 10 are patterned. In the patterning, first, a dry film resist (manufactured by TOKYO OHKA KOGYO CO., LTD. or the like) is laminated by a laminator, and is dried at 110° C. for 90 seconds. Then, exposure is carried out with an aligner using a mask corresponding to the pattern. After that, development is carried out using a developer (NMD-W manufactured by TOKYO OHKA KOGYO CO., LTD.) Etching is carried out by immersion in an etchant such as ammonium fluoride for fifteen minutes. Finally, the resist is stripped off by a resist stripper (Stripper 104 manufactured by TOKYO OHKA KOGYO CO., LTD.) to complete the predetermined patterning.

Then, in a process corresponding to FIGS. 5A to 5C, the metal film 9 formed on the inner surfaces of the penetrating electrodes 4 and the bumps 10 are embedded by plating. Then, the unnecessary barrier/seed layer 7 is removed.

Finally, as illustrated in FIG. 9, the semiconductor apparatus Wa are cut and separated into individuals from the wafer W by dicing using an ordinary dicer to complete the semiconductor apparatus. In this example, about 550 chips can be obtained from the 6-inch wafer.

Figure 10:
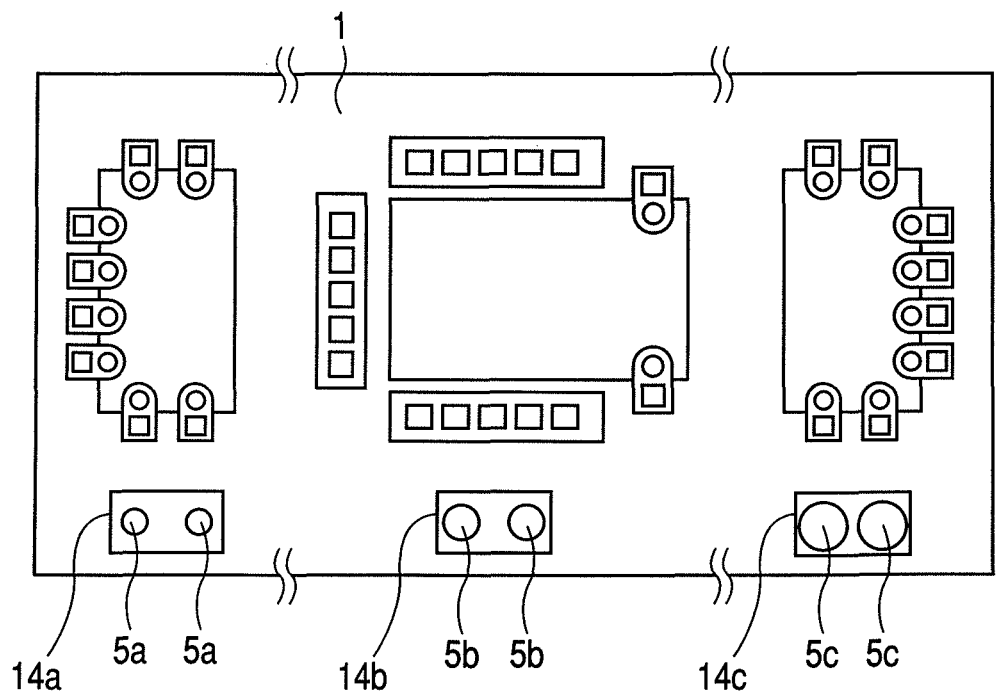
FIG. 10 is a plan view illustrating a modification.

FIG. 10 illustrates a modification. The check pattern is divided into portions for the respective areas of the openings, i.e., for the respective penetrating electrodes for checking 5a to 5c. The divided check pattern wiring 14a to 14c are connected to two of the penetrating electrodes for checking 5a to 5c having the same area of the openings, respectively, and are arranged so as to be spaced from one another in a place which is not used in the product chip. In this way, the check pattern may be arranged without making the product larger.

While the present invention has been described with reference to exemplary embodiments, it is to be understood that the invention is not limited to the disclosed exemplary embodiments.

This application claims the benefit of Japanese Patent Application Nos. 2008-068714, filed Mar. 18, 2008 and 2009-059558, filed Mar. 12, 2009, which are hereby incorporated by reference in their entirety.

The invention claimed is:

1. A semiconductor apparatus comprising:
    a semiconductor substrate, having a substrate through-hole, formed therein;
    a penetrating electrode for electrically connecting a device arranged on a surface of said semiconductor substrate and a rear surface of said semiconductor substrate by a first conductive layer formed on an inner surface of said substrate through-hole,
    wherein said semiconductor apparatus further comprises:
        a first through-hole, having a larger opening area than said substrate through-hole;
        a second through-hole, having a larger opening area than said substrate through-hole;
        a third through-hole, having a smaller opening area than said substrate through-hole;
        a fourth through-hole, having a smaller opening area than said substrate through-hole;
        a second conductive layer, formed on the inner surface of said first through-hole and electrically connecting a first electrode pad arranged on the surface of said semiconductor substrate with a first extraction electrode arranged to measure a resistance value from the rear surface of said semiconductor substrate;
        a third conductive layer, formed on the inner surface of said second through-hole and electrically connecting the first electrode pad with a second extraction electrode arranged to measure a resistance value between the first extraction electrode and the second extraction electrode from the rear surface of said semiconductor substrate;
        a fourth conductive layer, formed on the inner surface of said third through-hole and electrically connecting a second electrode pad arranged on the surface of said semiconductor substrate with a third extraction electrode arranged to measure a resistance value from the rear surface of said semiconductor substrate; and
        a fifth conductive layer, formed on the inner surface of said fourth through-hole and electrically connecting a second electrode pad with a fourth extraction electrode arranged to measure a resistance value between the third extraction electrode and the fourth extraction electrode from the rear surface of said semiconductor substrate.

2. The semiconductor apparatus according to claim 1, wherein said conductive layers each comprise a barrier/seed layer and a plating layer.

3. The semiconductor apparatus according to claim 2, wherein said barrier/seed layer comprises Ti or Au.

* * * * *